United States Patent [19]

Miyoshi et al.

[11] 4,058,821
[45] Nov. 15, 1977

[54] PHOTO-COUPLER SEMICONDUCTOR DEVICE AND METHOD OF MANUFACTURING THE SAME

[75] Inventors: Tadahiko Miyoshi, Hitachi; Yasutoshi Kurihara, Katsuta; Tatsuya Kamei; Takuzo Ogawa, both of Hitachi, all of Japan

[73] Assignee: Hitachi, Ltd., Japan

[21] Appl. No.: 668,404

[22] Filed: Mar. 19, 1976

[30] Foreign Application Priority Data

Apr. 2, 1975 Japan .................................. 50-39155

[51] Int. Cl.² .......................................... H01L 31/12
[52] U.S. Cl. ...................................... 357/19; 357/17; 357/72; 357/73; 250/551
[58] Field of Search ...................... 357/19, 73, 72, 17; 250/551, 17; 427/82

[56] References Cited

U.S. PATENT DOCUMENTS

| | | | |
|---|---|---|---|
| 3,413,480 | 11/1968 | Biard | 250/211 |
| 3,436,548 | 4/1969 | Biard | 250/211 |
| 3,845,318 | 10/1974 | Thillays | 250/551 |

*Primary Examiner*—Martin H. Edlow
*Attorney, Agent, or Firm*—Craig & Antonelli

[57] ABSTRACT

A photo-coupler semiconductor device includes a semiconductor light emitter and a semiconductor light detector coupled optically with each other through an optical guide. A portion of the optical guide close to the semiconductor light detector is made of glass. The glass portion of the optical guide is brought into intimate contact with a glass layer which is formed on a light sensitive region of the semiconductor light detector. The intimate contact is made by melting the glass portion on the glass layer.

17 Claims, 13 Drawing Figures

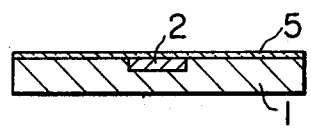
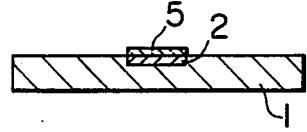
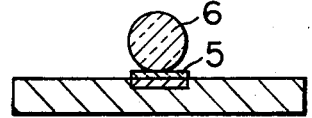
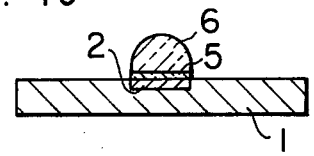
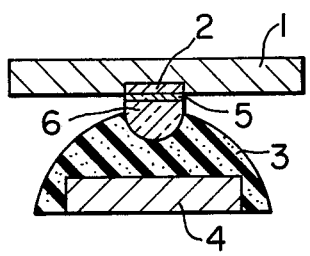
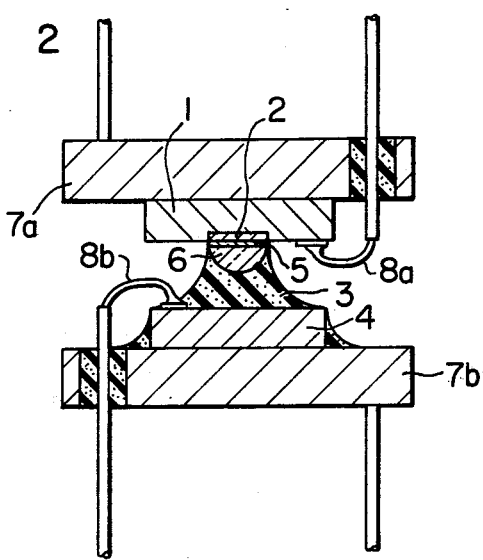

PHOTO-COUPLER SEMICONDUCTOR DEVICE AND METHOD OF MANUFACTURING THE SAME

BACKGROUND OF THE INVENTION

1. Field of the Invention

The present invention relates to a photo-coupler semiconductor device in which semiconductor light emitters and semiconductors light detectors are coupled optically with each other and a method of manufacturing the same.

2. Description of the Prior Art

Today, a photo-coupler semiconductor device (hereinafter referred simply to as photo-coupler), comprising a semiconductor light emitter and a semiconductor light detector coupled with each other optically, has been viewed as a new solid state device and is widely used for solid state relays and transmission lines as an isolation element. Especially, it has been seen that a photo-coupler array, having a plurality of photo-couplers arranged on a substate in parallel relation, and a combination circuit device of photo-couplers and integrated circuits have an extremely effective application to logic circuits or telephonic circuits.

In manufacturing a photo-coupler, the following points must be taken into consideration; (1) in increase in the dielectric breakdown voltage between the light emitter and the light detector by maintaining more than about 100 $\mu$m spacing therebetween and the prevention of erroneous operations due to electrostatic coupling be decreasing the electrostatic capacitance between the light emitter and the light detector; and (2) the prevention of erroneous operations due to stray light and an improvement in the light transmission efficiency between the light emitter and the light detector by focussing light emitted from the light emitter to assure a converged irradiation upon a light sensitive region of the light detector.

Hitherto, a photo-coupler satisfying the above-mentioned requirements has not been devised. One example of known photo-couplers comprises a light emitter and a light detector with opposing surfaces facing each other, on which a light emitting region and a light sensing region are provided respectively, and a transparent resin or glass interposed at an interface between the regions. With this construction, since the resin or glass extends over the entire area of the opposing surfaces of the light emitter and of the light detector, light emitted from the light emitter irradiates not only the highly photosensitive region of the light detector but also the remaining area of the surface facing the light emitter, with the result that the quantity of light incident on the light sensing region is decreased and the light transmission efficiency is impaired. To eliminate these drawbacks, an expedient has been proposed wherein, at the interface between the opposing surfaces of the light emitter and the light detector, there is interposed resin or glass along with a metal block which restricts the expansion of the resion or glass to a desired area of the light detector. However, in manufacturing photo-coupler arrays or integrated circuits with photo-couplers, the area of the light sensing region of the light detector undergoes a limitation to a maximum of about 100 $\times$ 100 $\mu$m to satisfy the need for highly concentrated integration. The use of the metal block made in such case suffers from extreme ficulties in the accurate alignment of the metal mold with the light emitter and the light detector, giving rise to a fatal cause for impairing the yield rate of the mass production of photo-couplers.

SUMMARY OF THE INVENTION

An object of the present invention is to provide a novel photo-coupler semiconductor device which has a high light transmission efficiency, a high stability and a high reliability.

Another object of the invention is to provide a method of manufacturing a photo-coupler semiconductor device having a high light transmission efficiency, a high stability and a high reliability through mass probuction with a high yield rate.

A photo-coupler semiconductor device, according to the invention, comprising an optical guide for optically coupling a semiconductor light emitter with a semiconductor light detector, is characterized in that at least a part of the optical guide close to the semiconductor light detector includes a transparent glassportion, and that the glass portion of the optical guide is brought into intimate contact with a transparent glass layer which essentially contains $SiO_2$ and is formed on a surface of the light sensitive region of the semiconductor light detector.

A method of manufacturing a photo-coupler semiconductor device according to the invention is characterized by comprising the steps of forming a transparent glass layer at least on a surface of a light sensitive region of a semiconductor light detector, and bringing a surface of the transparent glass layer into intimate contact with a glass portion which constitutes at least a part of an optical guide for optically coupling a semiconductor light emitter with the semiconductor light detector.

The intimate contact is made by melting the glass portion on the transparent glass layer.

The light sensitive region referred to in connection with the present invention stands for a depletion layer and its neighbourhood, which depletion layer is formed by reversely biasing a photosensitive PN junction of the semiconductor light detector.

In accordance with the manufacturing method of the present invention, the glass layer is formed on the surface of the light sensitive region and the glass portion constituting at least a part of the optical guide is brought into intimate contact with the glass layer. Thus, it is possible to align, without skill, the light sensitive region and the optical guide with high accuracy, giving rise to an effective mass production with high yield rate of photo-coupler semiconductor devices.

An extremely accurate alignment of the light sensitive region and the optical guide is provided. This assures the provision of a photo-coupler semiconductor device which has a high light transmission efficiency (in the case of the photo-coupler, photo-coupling efficiency) between the semiconductor light emitter and the semiconductor light detector and is capable of preventing erroneous operations of function elements which are possibly located adjacent to the semiconductor light detector.

Further, since the surface of the light sensitive region, covered with a protective coating such as a glass layer, is almost completely diactive and the optical guide is connected with the light sensitive region indirectly through the protective coating, the photo-coupler semiconductor device of the present invention enjoys stable and less deteriorative characteristics, that is, high reliability.

The thickness of the glass layer used can be determined to a desired value within such a range that cracks due to the difference in the thermal expansion coefficient between the glass layer and the semiconductor light detector will not be created in the glass layer. The glass layer will be formed on at least the surface of the light sensitive region by means of such a method as chemical vapor deposition, sputtering, spraying, printing and thermal oxidization, or by means of a combination thereof. When a glass layer extends over the light sensitive region surface and the remaining area on the surface of the semiconductor light detector, the glass layer on the surface of the light sensitive region preferably has a larger thickness than the rest. The difference in thickness in the order of 1 $\mu$m is satisfactory for ordinary melting conditions (a glass viscosity of about $10^4$ poises), although it depends on the viscosity of the glass portion when it is melted and is brought into intimate contact with the glass layer.

The glass portion may be in solid phase, liquid phase, or a paste of glass powders, provided that it has the ability for intimate contact with the glass layer and is solidified before the photo-coupler is placed in use. The glass powders are used under the consideration of the fact that air bubbles in glass after melting will scatter light thereby to decrease the light transmission efficiency and that an increase in the melting temperature exceeding the working point of glass by 300° C, for the purpose of preventing the creation of air bubbles in the glass, will decrease the viscosity of the glass (to about $10^2$ poises) so that the glass tends to flow out from the glass layer on the surface of the light sensitive region to the remaining area.

The optical guide can be made entirely of the glass. Otherwise, the glass portion may be a part of the optical guide close to the light sensitive region. When the glass portion is a part of the optical guide close to the light sensitive region, the rest of the optical guide may be made of a transparent insulating material other than glass, for example, silicon rubber or epoxy resin.

BRIEF DESCRIPTION OF THE DRAWINGS

FIGS. 1a to 1f are schematic longitudinal section views showing an embodiment of a photo-coupler semiconductor device and of a method of manufacturing the same according to the present invention.

FIG. 2 is a schematic longitudinal section view of another embodiment of the invention.

DESCRIPTION OF THE PREFERRED EMBODIMENTS

Figure 3A:
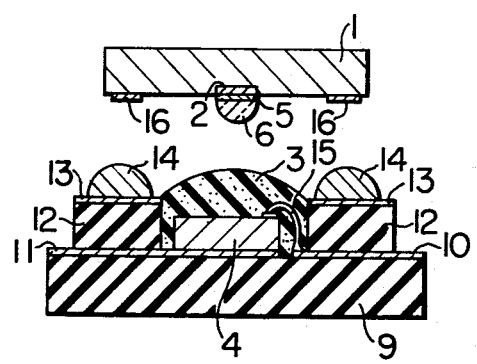
FIGS. 3a and 3b are schemtic longitudinal section views of still another embodiment of the invention.

FIGS. 1a to 1f show a manufacturing process of a photo-coupler embodying the present invention. As shown in FIG. 1a, a light detector 1 provided with a light sensitive region 2 is first prepared. The light sensitive region 2 includes a PN junction which is formed in a part of a surface of a silicon substrate by a diffusion process, for example. On the surface of the light detector 1 there is formed a glass layer 5, as shown in FIG. 1b. Then, the glass layer 5 is partially removed by photoetching as shown in FIG. 1c, leaving behind only a part of the glass layer covering the light sensitive region. As shown in FIG. 1d, a lump of glass designated 6 is placed on the glass layer 5, and is heated at a melting temperature (working temperature) of the glass lump so that the glass lump 6 is melted to be brought into contact with the glass layer 5, as shown in FIG. 1e. It should be understood that the glass lamp 6 expands only over the glass layer 5 on the light sensitive region, since the remaining part of the light detector surface removed of the glass layer lacks the tendency to intimately contact the glass and the surface tension of the melted glass creates the form of a semi-circular crosssection as shown in FIG. 1e. Successively, the melted glass is solidified by cooling. Finally, the light detector with the glass lump 6 attached to the light sensitive region 2 is positioned to face a semiconductor light emitter 4 and a transparent insulator layer 3 is place between them to couple the glass lump 6 with the light emitter 4 optically, as shown in FIG. 1f.

The manufacturing method as described above permits the glass layer 5 to be removed in part by photoetching so that the surface of the light sensitive region can be covered with the glass layer with high accuracy. Further, a simultaneous coating of the glass layer on a number of light sensitive regions formed in a single light detector substrate or wafer is possible, thereby improving the ease of mass production. A glass layer can also be formed as a large area of the light sensitive region by printing a glass paste and thereafter baking the same.

On the other hand, the lump 6 of glass is melted by heating and naturally caused to flow on the glass layer 5. Therefore, whenever placed on the glass layer, the glass lump, regardless of its location thereon, is heated and melted to come into natural contact with the surface of the glass layer, taking a nearly predetermined ultimate configuration depending on the shape of the glass layer and the size of the glass lump. Consequently, there is no need for precise alignment of the light sensitive region 2 with glass lump 6. Also, alignment of the glass lump 6 with the transparent insulator layer 3 is not serious and as far as the insulator layer 3 covering the light emitter 4 is held in contact with the glass lump 6, light emitted from the light emitter 4 passes through an optical guide consisting of the transparent insulator layer 3 and the glass lump 6 to reach the light sensitive region 2. In this manner, the manufacturing method in accordance with the invention does not require any precise alignment during the formation of the optical guide between the light emitter and the light detector, thereby assuring an easy formation of the optical guide as well as a high yield rate of mass production. Further, the extremely excellent optical connection between the light sensitive region and the optical guide permits a high light transmission efficiency between the light emitter and the light detector and prevents erroneous operation due to defective mounting, in terms of location, of the optical guide.

The transparent insulator layer 3 for connecting the glass lump 6 to the light emitter 4 may be made of glass, silicon rubber, epoxy resin or the like. If the thermal expansion coefficient of the glass lump is made nearly equal to that of the light detector and the transparent insulator is made of an organic resin having a larger pliability than glass, thermal stresses to be created during the heat cycle, owing to the difference in thermal expansion coefficient between the light emitter and the light detector, will be absorbed by the organic resin to relieve the thermal stresses.

EXAMPLE I

A silicon wafer, in which a planar phototransistor with a light sensitive region of 0.15 ×0.15 mm² area is formed, is heated at about 430° C in an atmosphere of SiH₄ gas diluted with N₂ gas and O₂ gas to create thermally an SiO₂ film of about 1 μ m thickness on the surface of the wafer. Next, the SiO₂ film is partially removed by photoetching to leave behind an SiO₂ film on the light sensitive region surface, a glass ball (glass IP-750 made by Innotech Company) of 0.15 mm diameter is placed on the SiO₂ film as has been described with reference to FIG. 1d, and is heated at 730° C to melt the glass ball. The melted glass flows on the surface of the SiO₂ film and comes into contact with the overall surface of the SiO₂ film eventually to form a convex lump of glass on the SiO₂ layer. Thereafter, the silicon wafer is cut into a chip of 0.6 × 0.6 mm² area which includes the light sensitive region thus to produce a light detector as shown in FIG. 1e in terms of cross-section configuration. As shown in FIG. 2, the bottom surface of the light detector 1 thus prepared through the aforementioned process is fixed on a gold plated surface of a stem 7a made of an Fe-Ni-Co alloy, and a electrode on the upper surface of the light detector is connected by a wire bonding method to a stem lead through a connection line 8a made of gold.

On the other hand, fixed on a stem 7b with a solder of Au-Ge alloy is a light emitter 4 of a 0.4 mm square silicon-doped Ga-As light emitting diode with its light emitting surface facing upward, and an electrode on the light emitting surface is connected to a stem lead through a connection line 8b made of gold, as shown in FIG. 2.

Then, as shown in FIG. 2, the stem 7b for the light emitter 4 and the stem 7a for the light detector 1 are positioned to face each other, an epoxy resin is provided between the light emitter and the light detector, and the resin is thermally hardened to form an insulator layer 3 as a part of an optical guide. It should be understood that the epoxy resin between the light emitter 4 and the glass lump 6 suspended from the glass lump 6 to flare on the light emitting surface with the effects of its surface tension, adhesive force and weight, and the flared configuration of the epoxy resion is suitable for focussing light emitted from the light emitter and for transmitting it to the light sensitive region 2 through the glass lump 6.

As will be understood from the foregoing, this example requires alignments during (a) placing the glass lump on the glass layer (the SiO₂ film) and (b) positioning the light detector to face the light emitter, but each alignment needs only a relatively low accuracy for its completion, and an optical guide with high lighttransmission efficiency can be obtained.

EXAMPLE II

Figure 3B:
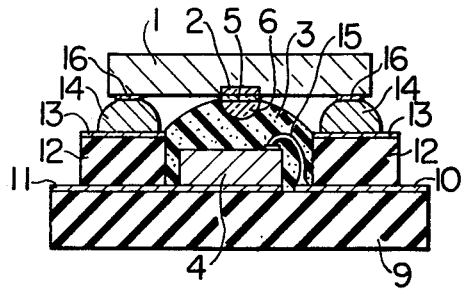

As shown in FIG. 3a, in a similar manner to Example I, a light detector 1 with a light sensitive region 2 stacked with a glass layer 5 and a glass lump 6 is prepared. Numeral 16 corresponds to an annular electrode formed on the upper surface of the light detector. On the other hand, fixed on the surface of a ceramic substrate 9 having metalized layers 10 and 11 on its surface is an annular ceramic member 12 having a metalized layer 13 and a solder layer 14 thereon. Such a light emitter 4 as previously referred to is fixed on a part of the metalized layer 11 at the bottom of a central hole of the annular ceramic member 12. An electrode on the light emitting surface of the light emitter 4 is connected to the metalized layer 10 through a connection line 15. Thereafter, within the central hole there is provided silicon rubber (for example, silicon rubber EJC-245 produced by General the Electric Company), which is hardened by heating to form an insulator layer 3. Next, as shown in FIG. 3b, the light detector 1 is stacked on the ceramic substrate 9 such that the annular electrode layer 16 comes into contact with the solder layer 14 on the annular ceramic member 12, and the resultant structure is heated to bond thermally the electrode layer 16 with the solder layer 14. At the same time, the insulator layer 3 of the silicon rubber is attached to the glass lump 6 as shown in FIG. 3b. Since the silicon rubber used is very pliable even when hardened, it is sufficient to suitably adjust the heights of the glass lump 6 and the insulator layer 3 of the silicon rubber in order that the glass lump is connected with the insulator layer intimately by pressing the light detector 1 toward the ceramic substrate 9. Thus, an optical guide of high light transmission efficiency can be obtained.

In this example, since mounting the light detector to the ceramic substrate and bonding the glass lump to the insulator layer are accomplished simultaneously, a photo-coupler can be fabricated more easily than the method wherein a light detector is fixed on a substrate and then a transparent insulator is put between a glass lump and a light emitter. Further, as the insulator layer has a gentle convex-shape, any appreciable variation in the light transmission efficiency will not be caused even when the glass lump is not centered with the insulator layer to some extent. A photo-coupler manufactured by this example had a light transmission efficiency of about 40% between the light emitter and the light detector.

EXAMPLE III

Figure 4A:
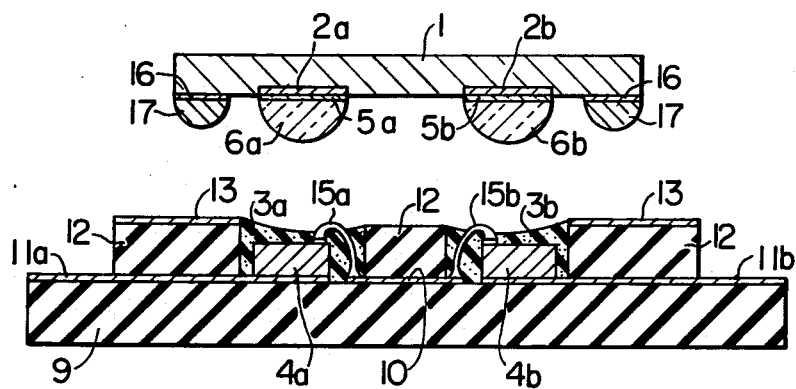
FIGS. 4a and 4b are schematic longitudinal section views of a further embodiment of the invention.

As shown in FIG. 4a, a silicon light detector1 having within one chip two light sensitive regions 2a and 2b is prepared. Each region (0.2 × 0.2 mm² area) includes a photo-thyristor. In a manner similar to Example I, the light sensitive regions 2a and 2b are covered with glass layers 5a and 5b, respectively, to which glass lumps 6a and 6b are fixed. An electrode 16 of the light detector is soldered with a solder layer 17. On the other hand, fixed on a ceramic substrate 9 having metalized layers 10, 11a and 11b on its surface is a ceramic member 12 with two holes formed therein and a metalized layer 13. On the metalized layers 11a and 11b at the bottoms of the holes are disposed light emitters 4a and 4b. Electrodes on the emitting surfaces of the light emitters are connected to the metalized layer 10 through connection lines 15a and 15b. Then, the two holes are filled with silicon rubber, as in Example II, to form insulator layers 3a and 3b.

Figure 4B:
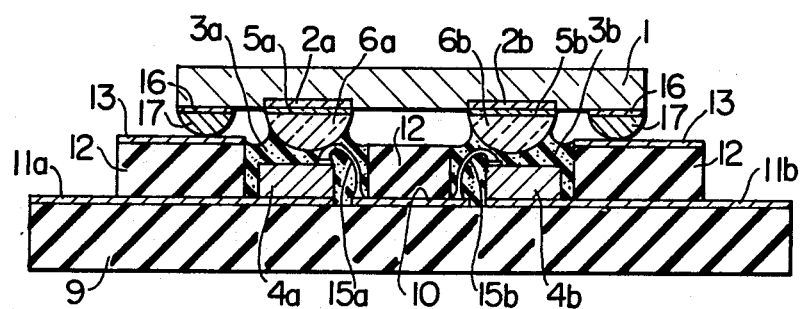

Next, as shown in FIG. 4b, the light detector 1 is stacked on the ceramic substrate 9 so as to provide intimate contact between the solder layer 17 and the metalized layer 13 as well as between the glass lumps 6a, 6b and the insulator layers 3a, 3b. With this construction, the silicon rubber comes into intimate contact with the glass lump and takes a suitable configuration, with the effect of its surface tension, for focussing light emitted from respective light emitters and for directing it to respective glass lumps. Finally, through a heat treatment, the solder layer and the metalized layer are melted to accomplish necessary electrical connection and the insulator layers 3a and 3b are hardened.

In the photo-coupler of this example, since light emitted from respective light emitters is focussed effectively by an optical guide of silicon rubber and glass and is irradiated effectively on an associated light sensitive region, a high light transmission efficiency is obtained and erroneous operations due to stray light are prevented.

Actually, with a sample of light detector coated with an $SiO_2$ thermal oxidation film on its entire surface and an $SiO_2$ CVD film of 1 μm thickness only on its light sensitive region, a trial photo-coupler was manufactured with the similar method of this example. No problem arose from the trial as the thickness of the $SiO_2$ film on the light sensitive region is different from that on the remaining portion.

EXAMPLE IV

Figure 5A:
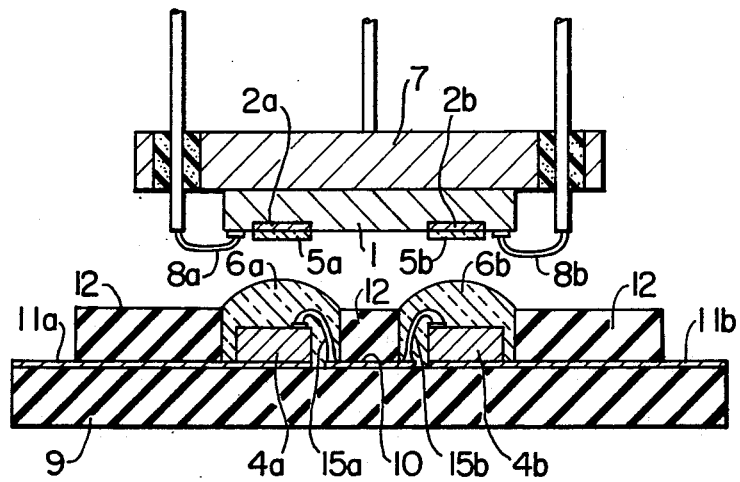
FIGS. 5a and 5b are schematic longitudinal section views of a still further embodiment of the invention.
Figure 5B:
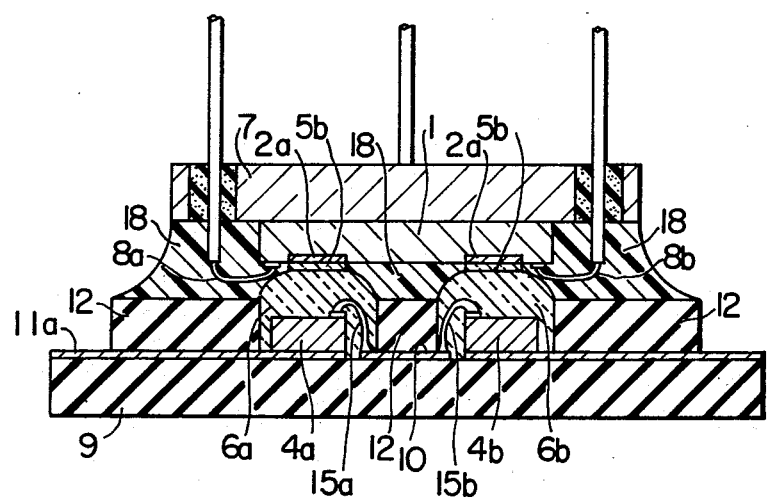

As shown in FIG. 5a, a silicon light detector 1 with light sensitive regions 2a and 2b of a photothyristor is prepared. On the light sensitive regions 2a and 2b there are formed phosphosilicate glass layers 5a and 5b, respectively, in a gaseous atmosphere of $SiH_4$, $PH_3$ and $O_2$ gases. The silicon light detector 1 is fixed on a stem 7 and electrodes on the light sensitive region are connected to stem leads through connection lines 8a and 8b. On the other hand, fixed on a ceramic substrate 9 having metalized layers 10, 11a and 11b on its upper surface is a ceramic member 12 having two holes. On the metalized layers 11a and 11b at the bottoms of the two holes are disposed light emitters 4a and 4b, and electrodes on the light emitting surfaces of the light emitters are connected to the metalized layer 10 through connection lines 15a and 15b. The two holes are filled with glass powder (for example, CIRCO GLASS P-140 produced by Matsushita Electric Industrial Co., Ltd.), which is subsequently heated at 600° C to be melted. Then, the temperature is decreased to 520° C, the stem 7 is stacked on the ceramic substrate 9 while maintaining contact between the glass layers 5a, 5b and the molten glass lumps 6a, 6b. The temperature is further decreased gradually to a room temperature to harden the glass lumps 6a and 6b. Thereafter, between the stem and the ceramic substrate, there is supplied a resin 18 opaque to infrared rays, for example TORAY moulding compound SH 305 produced by Toray Industries, Inc., which the resin is then thermally hardened.

In this example, the melted glass lump extends naturally on the glass layer coated on the light sensitive region and is effectively brought into intimate contact with the glass layer so that no precise alignment is required to build a necessary optical guide. The glass layer and the glass lump are melted to be mixed with each other and as a result, the optical guide formed between the light emitter and the light detector has almost uniform composition. This reduces the influence of light reflection usually caused at the interface between substances of different refractive indices and improves the light transmission efficiency. The opaque resin surrounding the optical guide completely eliminates stray light. Care should be taken due to the fact that the difference in thermal expansion coefficients of semiconductor materials for the light detector and for the light emitter from that of the optical guide tends to create thermal stress by which either the light detector or the emitter is damaged.

As will be understood from the foregoing description, the present invention has the following advantages.

1. Since the light sensitive region is protected by a glass coating, the light detector is stable and the surface of the light sensitive region becomes resistive to deterioration.

2. Where the transparent insulator of optical guide partially contains an organic resin, any thermal stress is relieved and the photo-coupler obtained becomes stable against thermal shock.

3. Since a very accurate alignment of the light sensitive region with the optical guide is not required, photo-couplers can be produced easily and the yield rate of mass production is high.

4. Sufficiently intimate optical coupling between the light sensitive region and the optical guide improves the light transmission efficiency between the light emitter and the light detector and reduces the influence of stray light thereby to prevent erroneous operations of photo-couplers.

We claim:

1. A photo-coupler semiconductor device comprising:
   a semiconductor light emitter;
   a semiconductor light detector facing the semiconductor light emitter, the semiconductor light detector having a light sensitive region formed in a part of a surface thereof;
   a transparent glass layer formed on the entire surface of the light sensitive region of the semiconductor light detector, the transparent glass layer essentially containing $SiO_2$; and
   a transparent optical guide interposed between the semiconductor light emitter and the semiconductor light detector for directing light from the semiconductor light emitter to the light sensitive region, at least a part of the optical guide close to the light sensitive region including a glass portion one surface of which intimately contacts a surface of the transparent glass layer.

2. A photo-coupler semiconductor device according to claim 1, wherein a part of the optical guide close to the semiconductor light emitter is made of a transparent resin.

3. A photo-coupler semiconductor device according to claim 2, wherein the semiconductor light emitter is surrounded by the transparent resin.

4. A photo-coupler semiconductor device according to claim 1, wherein the optical guide is made of glass.

5. A photo-coupler semiconductor device according to claim 4, wherein the glass portion of the optical guide has its cross-section of semi-circular form, a bottom portion of the semi-circular form contacting the glass layer.

6. A photo-coupler semiconductor device according to claim 5, wherein a portion of the optical guide except the glass portion is made of a resin.

7. A photo-coupler semiconductor device according to claim 4, wherein the glass layer is made of $SiO_2$.

8. A photo-coupler semiconductor device comprising:
   a semiconductor light emitter;
   a semiconductor light detector, having a light sensitive region provided in a surface thereof, disposed apart from and facing said semiconductor light emitter;
   a transparent glass layer consisting essentially of $SiO_2$ formed exclusively on the entirety of the surface of said light sensitive region; and a transparent optical guide interposed between and contiguous with both said light emitter and the entirety of the surface of said transparent glass layer which faces said light emitter, and wherein at least that portion of said optical guide with which said entirety of the surface of said transparent glass layer is contiguous is made of glass.

9. A photo-coupler semiconductor device according to claim 8, wherein that portion of said optical guide with which said light emitter is contiguous is made of a resin.

10. A photo-coupler semiconductor device according to claim 9, wherein the glass portion of said optical guide has a convex surface.

11. A photo-coupler semiconductor device according to claim 10, wherein the resin portion of said optical guide is contiguous with the glass portion of the optical guide, and the surface of the resin portion has a convex shape other than where the resin portion contacts the glass portion of the optical guide.

12. A photo-coupler semiconductor device according to claim 9, wherein the resin portion of said optical guide is contiguous with the glass portion of the optical guide, and the surface of the resin portion has a concave shape other than where the resin portion contacts the glass portion of the optical guide.

13. A photo-coupler semiconductor device according to claim 8, wherein that portion of said optical guide with which said light emitter is contiguous is made of glass.

14. A photo-coupler semiconductor device according to claim 13, wherein the glass portion of said optical guide is surrounded by resin.

15. A method of manufacturing a photo-coupler semiconductor device comprising the steps of:
 a. forming a transparent glass layer on the entire surface of a light sensitive region which region is formed in a part of a surface of a semiconductor light detector, the transparent glass layer essentially containing $SiO_2$;
 b. bringing transparent glass into intimate contact with only a surface of the transparent glass layer with the aid of a tendency of the transparent glass in its molten state to intimately contact the transparent glass layer, to thereby form a glass lump only on the transparent glass layer; and
 c. connecting the glass lump with a semiconductor light emitter through a transparent insulator, to thereby provide an optical guide between the semiconductor light emitter and the semiconductor light detector.

16. A method of manufacturing a photo-coupler semiconductor device comprising the steps of:
 a. forming a transparent glass layer on the entire surface of a light sensitive region formed in a part of a surface of a semiconductor light detector, the transparent glass layer essentially containing $SiO_2$;
 b. bringing transparent glass into intimate contact with only a surface of the transparent glass layer with the aid of a tendency of the transparent glass in its molten state to intimately contact the transparent glass layer, to thereby form a glass lump only on the transparent glass layer;
 c. positioning the glass lump and a semiconductor light emitter so as to face each other with a predetermined space therebetween;
 d. introducing a fluid transparent resin between said glass lump and said emitter; and
 e. solidifying the fluid transparent resin to thereby provide an optical guide which includes the glass lump and the solidified region.

17. A method of manufacturing a photo-coupler semiconductor device comprising the steps of:
 a. forming a transparent glass layer on the entire surface of a light sensitive region formed in a part of a surface of a semiconductor light detector, the transparent glass layer essentially containing $SiO_2$; and
 b. bringing fluid transparent glass into intimate contact with a surface of the transparent glass layer; and
 c. solidifying the fluid transparent glass to thereby provide an optical guide between the light sensitive region and a semiconductor light emitter.

* * * * *